United States Patent
Cho et al.

(10) Patent No.: US 9,774,714 B2
(45) Date of Patent: *Sep. 26, 2017

(54) METHOD FOR FABRICATING WINDOW MEMBER

(71) Applicant: SAMSUNG DISPLAY CO., LTD., Yongin, Gyeonggi-Do (KR)

(72) Inventors: Jong-Whan Cho, Yongin (KR); Hyeon-Deuk Hwang, Yongin (KR); Jong-Deok Park, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/592,147

(22) Filed: Jan. 8, 2015

(65) Prior Publication Data

US 2015/0208537 A1    Jul. 23, 2015

(30) Foreign Application Priority Data

Jan. 22, 2014  (KR) .......................... 10-2014-0007507

(51) Int. Cl.
*H01B 13/00* (2006.01)
*B29D 11/00* (2006.01)
(Continued)

(52) U.S. Cl.
CPC ........... *H04M 1/0266* (2013.01); *B32B 37/02* (2013.01); *B32B 37/12* (2013.01); *B32B 37/182* (2013.01);
(Continued)

(58) Field of Classification Search
None
See application file for complete search history.

(56) References Cited

U.S. PATENT DOCUMENTS

| 6,355,345 | B1 | 3/2002 | Furuya et al. |
| 6,770,499 | B1* | 8/2004 | Chyr ................. H01S 5/125 372/43.01 |
| 2005/0143544 | A1* | 6/2005 | Husemann ........... C08F 20/12 526/319 |
| 2010/0277684 | A1* | 11/2010 | Fukushima ......... H01L 51/5237 349/158 |
| 2013/0223016 | A1* | 8/2013 | Kim ..................... G06F 3/044 361/728 |
| 2013/0295349 | A1* | 11/2013 | Yamasaki ............ G06F 3/0412 428/203 |
| 2013/0301272 | A1* | 11/2013 | Wang .................... G06F 1/1656 362/293 |

(Continued)

FOREIGN PATENT DOCUMENTS

JP       2008084323 A    4/2008
KR    10-2008-0063103   7/2008

(Continued)

OTHER PUBLICATIONS

Office Action issued in related U.S. Appl. No. 14/592,109 dated Apr. 17, 2017.

*Primary Examiner* — Stephanie Duclair
(74) *Attorney, Agent, or Firm* — Lee & Morse, P.C.

(57) ABSTRACT

A method for fabricating a window member is provided. A transparent substrate including a transmitting region and a non-transmitting region may be prepared. A light curable adhesive layer may be disposed on the transparent substrate. A plurality of micro patterns may be disposed on the transparent substrate or the light curable adhesive layer in the non-transmitting region. The light curable adhesive layer may be cured by light irradiation. The light curable adhesive layer may include a transparent adhesive. A storage modulus of the transparent adhesive may be greater than or equal to about $10^3$ Pa and less than about $10^6$ Pa at room temperature before curing, and greater than or equal to about $10^6$ Pa at room temperature after curing.

15 Claims, 7 Drawing Sheets

(51) Int. Cl.
   *C03C 15/00* (2006.01)
   *C03C 25/68* (2006.01)
   *B44C 1/22* (2006.01)
   *C23F 1/00* (2006.01)
   *H01L 21/311* (2006.01)
   *H01L 21/302* (2006.01)
   *H04M 1/02* (2006.01)
   *H01L 27/32* (2006.01)
   *G02F 1/1333* (2006.01)
   *B32B 37/18* (2006.01)
   *B32B 37/02* (2006.01)
   *B32B 37/12* (2006.01)
   *H01L 23/00* (2006.01)

(52) U.S. Cl.
   CPC .......... *G02F 1/13338* (2013.01); *H01L 27/32* (2013.01); *H01L 27/3225* (2013.01); *H01L 24/26* (2013.01); *H01L 27/3227* (2013.01)

(56) References Cited

U.S. PATENT DOCUMENTS

2014/0211105 A1* 7/2014 Cho .................... G02F 1/13338
                                                          349/12
2015/0346408 A1   12/2015 Mizutani et al.

FOREIGN PATENT DOCUMENTS

| KR | 10-2009-0030932 A | 3/2009 |
| KR | 10-0948041 B1 | 3/2010 |
| KR | 10-1064644 B1 | 9/2011 |
| WO | WO 2008/082030 A1 | 7/2008 |

\* cited by examiner

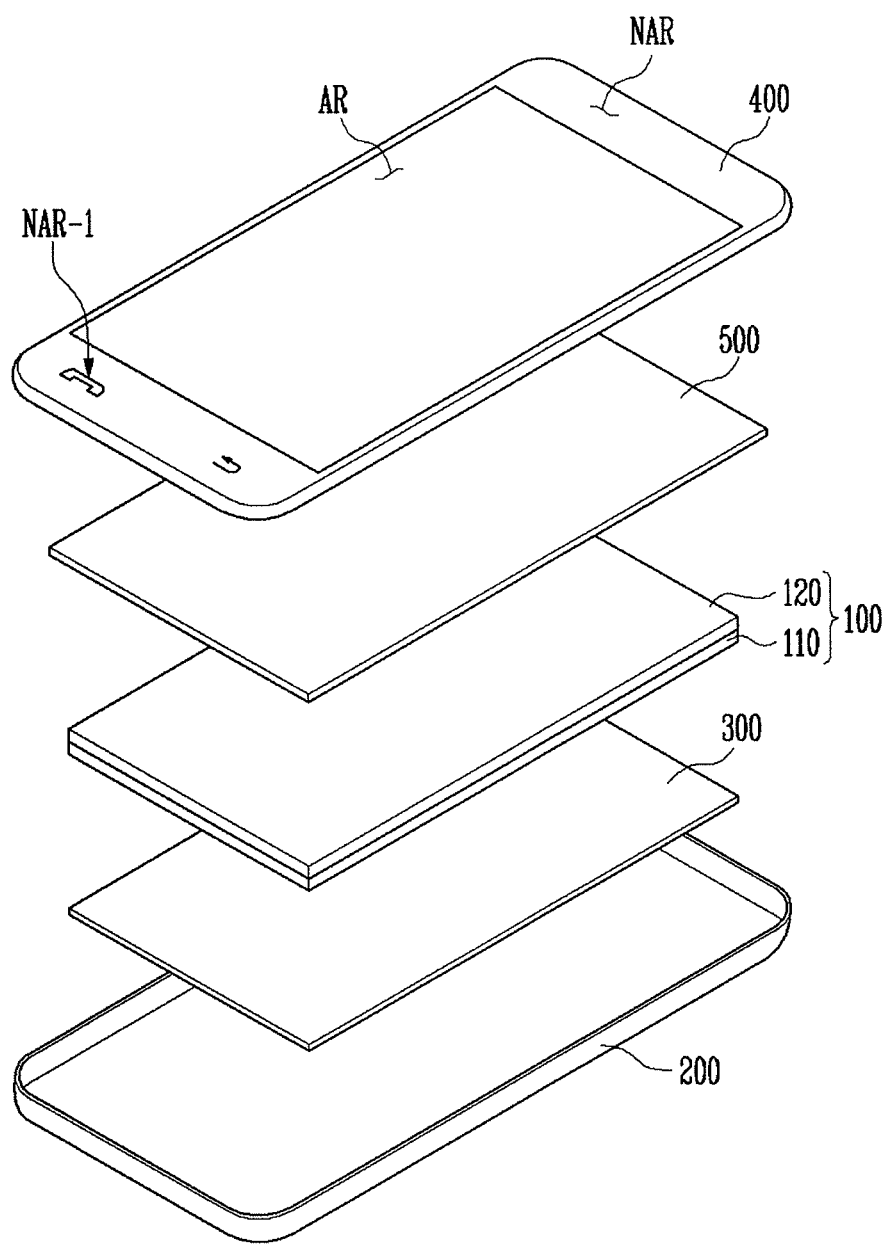

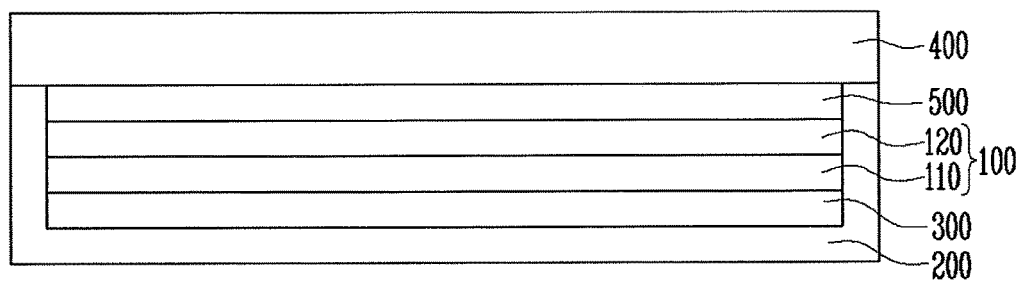
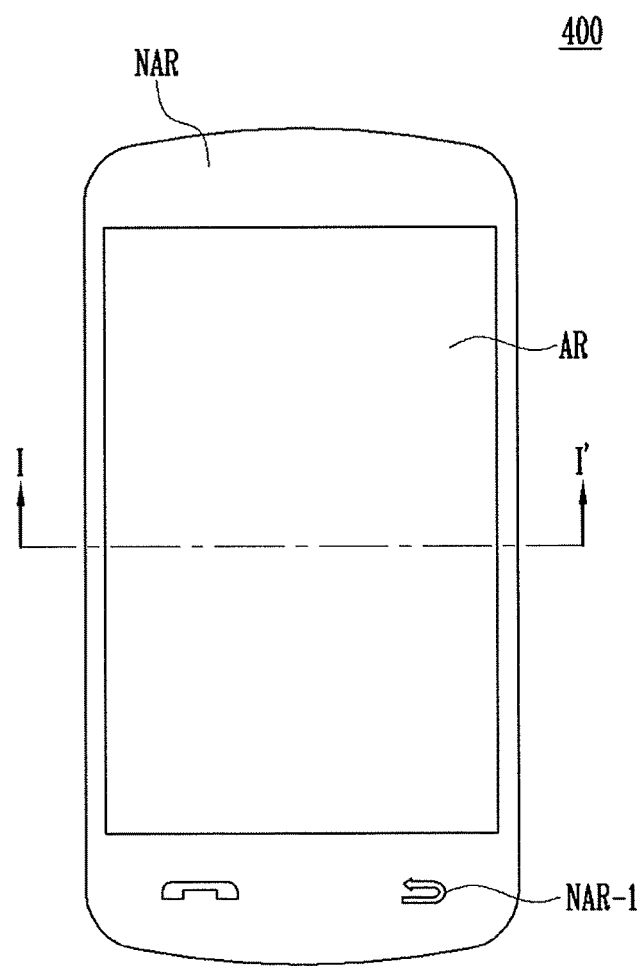

METHOD FOR FABRICATING WINDOW MEMBER

CROSS-REFERENCE TO RELATED APPLICATION

Korean Patent Application No. 10-2014-0007507, filed on Jan. 22, 2014, in the Korean Intellectual Property Office, and entitled: "Method For Fabricating Window Member," is incorporated by reference herein in its entirety.

BACKGROUND

1. Field

Embodiments relate to methods for fabricating a window member.

2. Description of the Related Art

With the development of the information society, mobile apparatus such as a cellular phone, a navigation device, a digital camera, an e-book, and a mobile game device are often used. The mobile apparatus has a display panel to display information. The display panel, such as an organic light emitting display panel (OLED panel), a liquid crystal display panel (LCD panel), an electo-phoretic display panel (EPD panel), and an electo-wetting display panel (EWD panel) is applied to the mobile apparatus. The mobile apparatus has the display panel, a housing to receiving the display panel, and a window to protect an exposed surface of the display panel.

SUMMARY

Embodiments are directed to a method for fabricating a window member is provided. A transparent substrate including a transmitting region and a non-transmitting region may be prepared. A light curable adhesive layer may be disposed on the transparent substrate. A plurality of micro patterns may be disposed on the transparent substrate or the light curable adhesive layer in the non-transmitting region. The light curable adhesive layer may be cured by light irradiation. The light curable adhesive layer may include a transparent adhesive. A storage modulus of the transparent adhesive may be greater than or equal to about $10^3$ Pa and less than about $10^6$ Pa at room temperature before curing, and greater than or equal to $10^6$ Pa at room temperature after curing.

Disposing the micro patterns may include disposing a photoresist pattern on the light curable adhesive layer, the photoresist pattern having holes exposing the light curable adhesive layer in non-transmitting region; etching the light curable adhesive layer using the photoresist pattern; and removing the photoresist pattern. The method may further include disposing a deposition layer having a plurality of layers having different refraction index on the light curable adhesive layer; removing the light curable adhesive layer and the deposition layer in the transmitting region; and disposing a light blocking layer on the deposition layer in the non-transmitting region. Disposing the deposition layer may include disposing a first layer transmitting light on the light curable adhesive layer; and disposing a second layer having a refraction index less than a refraction index of the first layer on the first layer. Disposing the micro patterns may include disposing a photoresist pattern on the transparent substrate, the photoresist pattern having holes exposing the transparent substrate in non-transmitting region; etching the light curable adhesive layer using the photoresist pattern; and removing the photoresist pattern.

The transparent adhesive may include an acrylic copolymer composed of solution polymerizable acrylic compounds and reactive initiators, and UV curable compounds. The solution polymerizable acrylic compounds may include at least one of acrylic acid, 2-ethylhexyl acrylate, 2-methylbutyl acrylate, isooctyl acrylate, lauryl acrylate, ethyl acrylate, butyl acrylate, hexyl acrylate, octyl acrylate, decyl acrylate, isodecyl acrylate and a combination thereof. The solution polymerizable acrylic compounds may include from about 30 percent by weight to about 60 percent by weight of butyl acrylate, from about 30 percent by weight to about 60 percent by weight of 2-ethylhexyl acrylate, and from about 0.1 percent by weight to about 40 percent by weight of acrylic acid based on a total weight of the solution polymerizable acrylic compounds. The reactive initiators may include at least one of benzoyl peroxide, acetyl peroxide, dilauryl peroxide, hydrogen peroxide, potassium persulfonate, 2,2'-azobis(isobutyronitrile), and a combination thereof.

The UV curable compounds may include at least one of caprolactone acrylate, 1,6-hexanediol diacrylate, trimethylolpropane triacrylate, pentaerythritol triacrylate, lauryl acrylate, urethane acrylate, epoxy acrylate, polyester acrylate, silicon acrylate, and a combination thereof. The UV curable compounds may include from about 5 percent by weight to about 50 percent by weight of trimethylolpropane triacrylate, from about 5 percent by weight to about 50 percent by weight of multi-functional urethane acrylate, and from about 5 percent by weight to about 50 percent by weight of 1,6-hexanediol diacrylate based on a total weight of the UV curable compounds. The transparent adhesive may further include one or more photoinitiators. The acrylic copolymer and the UV curable compounds may be in a weight ratio of from about 70:30 to about 95.5:0.5 in the transparent adhesive. The storage modulus of the transparent adhesive may be greater than or equal to about $10^7$ Pa at room temperature after curing.

BRIEF DESCRIPTION OF THE DRAWINGS

Features will become apparent to those of ordinary skill in the art by describing in detail exemplary embodiments with reference to the attached drawings in which:

FIG. 1 illustrates an exploded perspective view of a mobile apparatus having a window member.

FIG. 2 illustrates a cross-sectional view of the mobile apparatus in FIG. 1.

FIG. 3 illustrates a plan view of the window member in FIG. 1.

DETAILED DESCRIPTION

Figure 4:
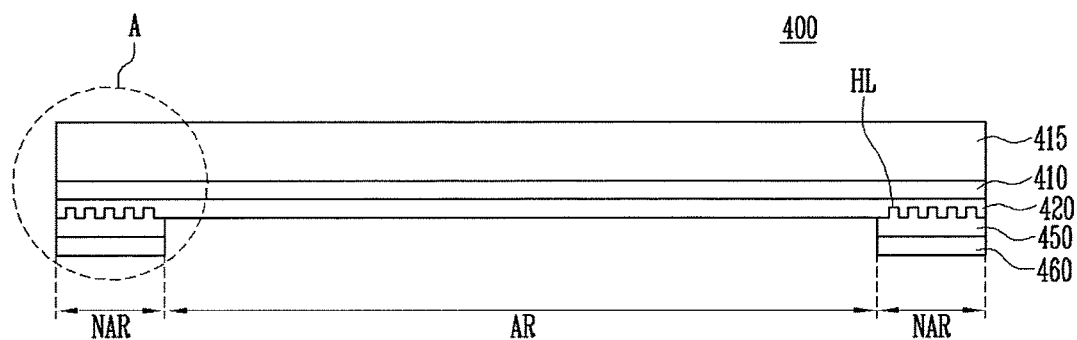
FIG. 4 illustrates a cross-sectional view taken along line I-I' of FIG. 3.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art. The present disclosure may be modified variably and may have various embodiments, particular examples of which will be illustrated in drawings and described in detail. However, it is to be understood that the present disclosure is not limited to a specific disclosed form, but includes all modifications, equivalents, and substitutions without departing from the scope and spirit of the present disclosure.

In describing drawings, like numbers refer to like elements. In the accompanying drawings, dimensions of structures may be exaggerated for clarification. While terms such as "first," and "second," and the like, may be used to describe various components, such components are not limited to the above terms. The above terms are used only to distinguish one component from another. For example, a first component may be referred to as a second component without departing from the scope of rights of the present disclosure, and likewise a second component may be referred to as a first component. As used herein, the singular forms "a," "an," and "the" are intended to include the plural forms as well, unless the context clearly indicates otherwise.

Terms such as "including," "having," or the like, indicate the existence of the features, numbers, operations, actions, components, parts, or combinations thereof in the specification, and are not intended to preclude the possibility that one or more other features, numbers, operations, actions, components, parts, or combinations thereof may exist or may be added. When an element such as a layer, film, region, or substrate is referred to as being "on" another element, it can be directly on the other element or intervening elements may also be present. When an element such as a layer, film, region, or substrate is referred to as being "beneath" another element, it can be directly on the other element or intervening elements may also be present.

FIG. 1 illustrates an exploded perspective view of a mobile apparatus having a window member, and FIG. 2 illustrates a cross-sectional view of the mobile apparatus in FIG. 1. Referring to FIGS. 1 and 2, a mobile apparatus may include a display panel 100, a housing 200 for receiving the display panel 100, an impact absorption sheet 300 disposed between the display panel 100 and the housing 200, a window member 400 disposed over the display panel 100, and an adhesive sheets 500 disposed between the display panel 100 and the window member 400.

The display panel 100 may display, for example, an image. For example, the display panel 100 may include self light-emitting display panels such as an organic light emitting display (OLED) panel, a plasma display panel (PDP), and the like. Further, the display panel 100 may include non-emissive display panels such as a liquid crystal display (LCD) panel, an electro-phoretic display (EPD) panel, an electro-wetting display (EWD) panel, and the like. When a non-emissive display panel may is used as the display panel 100, for example, a display device may include a back-light unit that supplies light to the display panel 100. As an example, the display panel 100 is described as an organic light emitting display (OLED) panel.

The display panel 100 may include a first substrate 110 having an organic light emitting device as a display device, and a second substrate 120 facing the first substrate 110. The first substrate 110 may include a thin film transistor substrate having an insulation substrate and at least one of thin film transistor on the insulation substrate, and the organic light emitting device electrically connected to the thin film transistor. The first substrate 110 may have a driver on a side of the thin film transistor substrate and driving the organic light emitting device. The driver may be, for example, a chip-on-glass (COG) type driving device.

The organic light emitting device may be disposed on the thin film transistor substrate. The organic light emitting device may include a first electrode electrically connected to the thin film transistor, an organic layer disposed on the first electrode, and a second electrode disposed on the organic layer. One of the first electrode and the second electrode may be anode, and the other of the first electrode and the second electrode may be cathode. At least one of the first electrode and the second electrode may be a transparent electrode. For example, the first electrode may include a transparent conductive oxide, e.g., indium tin oxide (ITO), indium zinc oxide (IZO), aluminum zinc oxide (AZO), gallium-doped zinc oxide (GZO), zinc tin oxide (ZTO), gallium tin oxide (GTO), fluorine-doped tin oxide (FTO), a combination thereof, or the like.

The second electrode may reflect light. The second electrode may include a material having a work function less than that of the first electrode. For example, the second electrode may include molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or an alloy thereof.

The organic layer may include at least an emitting layer (EML) and may generally have a multi-layered thin film structure. For example, the organic layer may include the emitting layer (EML) and/or at least one selected from a hole injection layer (HIL) for injecting a hole, a hole transport layer (HTL) having a superior transportation characteristic and for blocking migration of unbound electrons at the EML to increase a chance of hole-electron rebinding (the EML emitting light by rebinding the injected electrons to holes), a hole blocking layer (HBL) for suppressing migration of unbound holes at the EML, an electron transport layer (ETL) for smoothly transporting the electrons to the EML, and an electron injection layer (EIL) for injecting the electrons. The color of light generated in the EML may be, for example, red, green, blue, and/or white. Any suitable color or combination of colors of light can be generated. For example, the color of light generated in the EML may be magenta, cyan, and/or yellow.

The second substrate 120 may isolate the display device from the environment. The second substrate 120 may be coupled on the first substrate 110 through a sealant. For example, the second substrate 120 may be a transparent insulating substrate. When a transparent insulating layer seals the organic light emitting device, for example, the second substrate 120 may be omitted.

The polarization member may be disposed between the display panel 100 and the window member 400. The polarization member may prevent the image display performance of the display panel 100 from being lowered due to reflection of a light incident from the exterior (hereinafter, referred to as an external light). For example, the polarization member may include a polarization film having a polarization axis in a specific direction and a retardation film having a phase difference of about ¼λ. The polarization member may prevent the image display performance of the display panel 100 from being lowered due to reflection of the external light by converting the external light into a circular polarization. The polarization member may be omitted.

The housing 200 may receive the display panel 100. In FIG. 1, for example, there is illustrated a housing including a member having a space in which the display panel 100 may be received. The housing 200 may include two or more members. As an example, the housing 200 formed as one member is described. In addition to the display panel 100, the housing 200 may further receive a printed circuit board on which a plurality of active elements and/or a plurality of passive elements may be mounted. The housing 200 can receive a power supply such as a battery according to a type of display apparatus.

The impact absorption sheet 300 may be between the display panel 100 and the housing 200, and may absorb an external impact to the display panel 100. The impact absorption sheet 300 may prevent an external impact from impacting the display panel 100 directly. The impact absorption sheet 300 may include an impact absorption film capable of absorbing an external impact and an adhesive material coated on at least one of both surfaces of the impact absorption film. For example, the adhesive material may be coated on one surface of the impact absorption film such that the impact absorption sheet 300 may be fixed at the display panel 100 or the housing 200. The impact absorption film may include a rubber foam or a lamination of the rubber foam, and may have a thickness of about 300 μm.

The window member 400 may be disposed on a direction where an image may be output from the display panel 100. The window member 400 may be united with the housing 200 to form an outer surface of the display apparatus together with the housing 200. The window member 400 may include a transmission region AR for displaying an image generated from the display panel 100 and a non-transmission region NAR adjacent to at least a part of the transmission region AR. The non-transmission region NAR is generally not be used to display an image. The non-transmission region NAR may surround the transmission region AR. In addition, at least a part of the non-transmission region NAR may be defined as an input icon region NAR-I. The input icon region NAR-I may be activated, for example, when the display apparatus operates at a specific mode.

The adhesive sheet 500 may unite the display panel 100 and the window member 400. The adhesive sheet 500 may be transparent to reduce the possibility of and/or prevent the brightness of an image output from the display panel 100 from being reduced due to the adhesive sheet 500. For example, the adhesive sheet 500 may include a transparent polymer resin that may be adhesive and may be hardened by light or heat.

Figure 5:
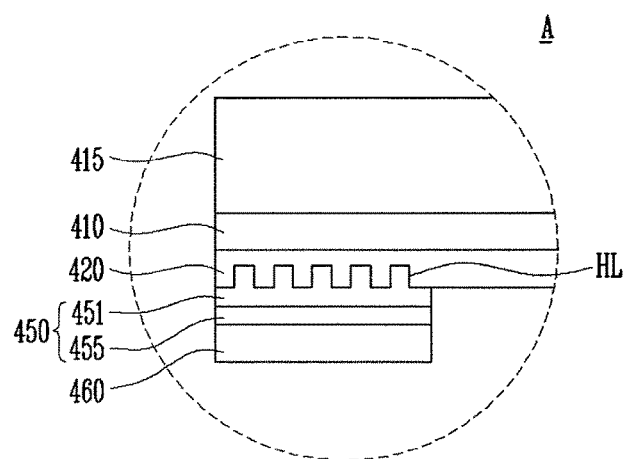
FIG. 5 illustrates an enlarged view of a region "A" in FIG. 4.
Figure 6:
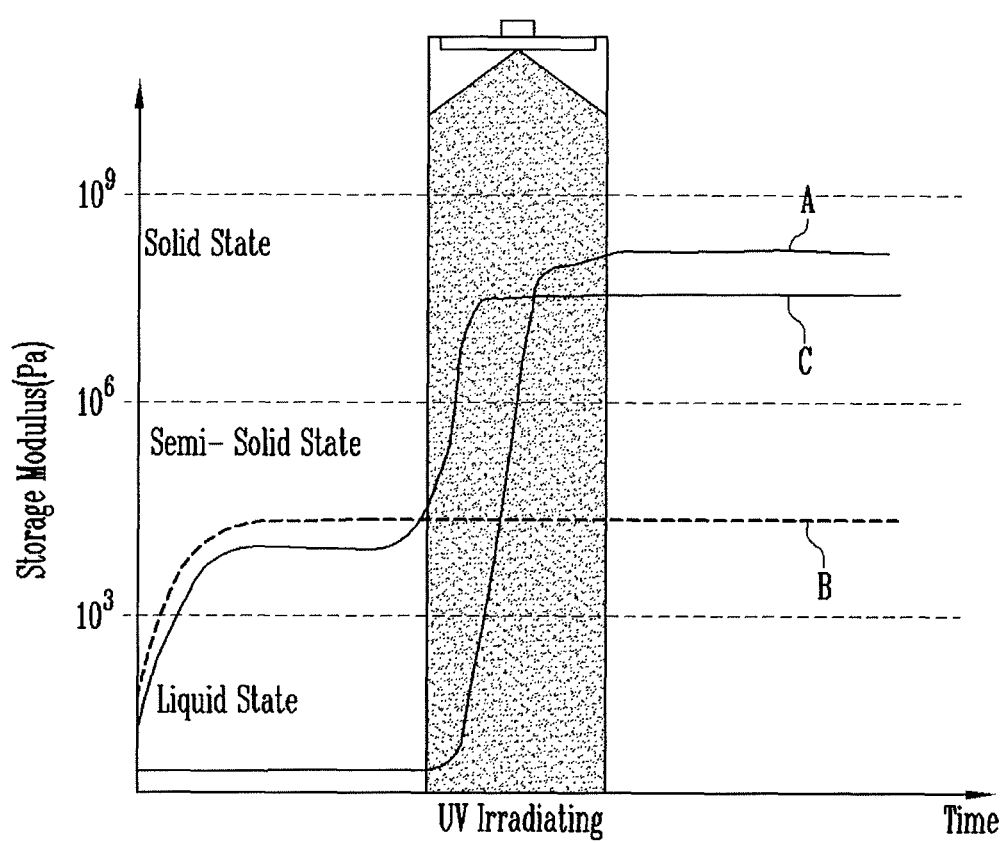
FIG. 6 illustrates a graph of storage modulus of a transparent adhesive in FIG. 3.

FIG. 3 illustrates a plane view illustrating the window member in FIG. 1, FIG. 4 illustrates a cross-sectional view taken along line I-I' of FIG. 3, FIG. 5 illustrates an enlarged view of a region "A" in FIG. 4, and FIG. 6 illustrates a graph illustrating storage modulus of a transparent adhesive in FIG. 3. Referring to FIGS. 3 to 6, a window member 400 may include a transmission region AR light-transmittable and a non-transmission region NAR adjacent to at least a part of the transmission region AR. The non-transmission region NAR may surround the transmission region AR. In addition, at least a part of the non-transmission region NAR may be defined as an input icon region NAR-I.

The window member 400 may include a transparent substrate 410, a light curable adhesive layer 420, a deposition layer 450, and a light blocking layer 460. The transparent substrate 410 may be square shape having rounded corners. The transparent substrate 410 may be a reinforced plastic substrate or reinforced glass substrate. A protection layer 415 may be disposed on a surface of the transparent substrate 410. The protection layer 415 may be an antifouling (AF) coating layer. The protection layer 415 may prevent a fingerprint of the transparent substrate 410 and improve scratch resistance. The light curable adhesive layer 420 may be disposed on the other surface of the transparent substrate 410. A surface of the light curable adhesive layer 420 may make contact with the other surface of the transparent substrate 410.

In the non-transmission region NAR, a plurality of micro patterns HL, such as a hairline or a hologram, may be disposed on the other surface of the light curable adhesive layer 420. The micro patterns HL may provide aesthetics to user of the mobile apparatus. In addition, the light curable adhesive layer 420 may include a transparent adhesive. As shown FIG. 6, the transparent adhesive may be in a semi-solid state at room temperature before curing. A storage modulus of the transparent adhesive in semi-solid state may be, for example, greater than or equal to about $10^3$ Pa to less than about $10^6$ Pa at room temperature before curing.

The transparent adhesive may be cured to solid state by irradiating UV (C). The storage modulus of the transparent adhesive in solid state may be greater than or equal to about $10^6$ Pa at room temperature after curing. The storage modulus of the transparent adhesive in solid state may be greater than or equal to about $10^7$ Pa at room temperature after curing. The transparent adhesive may be different from a pressure sensitive adhesive PSA (B) in semi-solid state after irradiating UV, or an UV curable adhesive (A). The UV curable adhesive may be in a liquid phase and have a storage modulus, for example, less than or equal to about $10^3$ Pa at room temperature before curing. The UV curable adhesive may be solid phase and have a storage modulus, for example, greater than or equal to about $10^6$ Pa at room temperature after curing.

The transparent adhesive may include an acrylic copolymer and an UV curable compound. The acrylic copolymer may be composed of one or more solution polymerizable acrylic compounds and reactive initiators. The solution polymerizable acrylic compounds may include compounds having adhesion by solution polymerization. The solution polymerizable acrylic compounds may include, for example, at least one of acrylic acid, 2-ethylhexyl acrylate, 2-methylbutyl acrylate, isooctyl acrylate, lauryl acrylate, ethyl acrylate, butyl acrylate, hexyl acrylate, octyl acrylate, decyl acrylate, isodecyl acrylate and a combination thereof. For example, the solution polymerizable acrylic compounds may include butyl acrylate, 2-ethylhexyl acrylate, and acrylic acid. The solution polymerizable acrylic compounds may include, for example, from about 30 percent by weight to about 60 percent by weight of butyl acrylate, from about 30 percent by weight to about 60 percent by weight of 2-ethylhexyl acrylate, and from about 0.1 percent by weight to about 40 percent by weight of acrylic acid based on the total weight of the solution polymerizable acrylic compounds.

The reactive initiators may be thermal initiators. The thermal initiator may be decomposed by heat to produce a radical, and the synthesis reaction may be initiated by radical. For example, the thermal initiator may include at least one of benzoyl peroxide, acetyl peroxide, dilauryl peroxide, hydrogen peroxide, potassium persulfonate, 2,2'-azobis(isobutyronitrile). The transparent adhesive may include, for example, from about 100 part by weight of the solution polymerizable acrylic compounds and from about 0.1 part by weight to about 15 part by weight of the reactive initiators based on the total weight of the transparent adhesive. The acrylic copolymer may have, for example, from about 200,000 to about 1,500,000 weight-average molecular weight.

The UV curable compounds may be a compounds capable of curing by UV. The UV curable compounds may include, for example, at least one of caprolactone acrylate, 1,6-hexanediol diacrylate, trimethylolpropane triacrylate, pentaerythritol triacrylate, lauryl acrylate, urethane acrylate, epoxy acrylate, polyester acrylate, silicon acrylate. For example, the UV curable compounds may include trimethylolpropane triacrylate, multi-functional urethane acrylate, and 1,6-hexanediol diacrylate. The UV curable compounds may include, for example, from about 5 percent by weight to about 50 percent by weight of trimethylolpropane triacrylate, from about 5 percent by weight to about 50 percent by weight of multi-functional urethane acrylate, and from about 5 percent by weight to about 50 percent by weight of 1,6-hexanediol diacrylate based on the total weight of the UV curable compounds. The acrylic copolymer and the UV curable compounds may be, for example, from about 70:30 to about 95.5:0.5 by weight ratio in the transparent adhesive. Thus, the transparent adhesive may have enough adhesion and be effectively cured by UV.

The transparent adhesive may further include photoinitiators. The photoinitiators may be decomposed by light to produce a radical, and the synthesis reaction may be initiated by a radical. The photoinitiators may be acetophenone group compounds. The transparent adhesive may include, for example, from about 100 part by weight of the UV curable compounds and from about 0.1 part by weight to about 5 part by weight of the photoinitiators. The deposition layer 450 may be on the other surface of the light curable adhesive layer 420. A surface of the deposition layer 450 may make contact with the other surface of the light curable adhesive layer 420. The deposition layer 450 may have a plurality of layers having different refraction indices. For example, the deposition layer 450 may be on a surface in a direction where an image may be output from the display panel 100 in the light curable adhesive layer 420. The deposition layer 450 may have a light-trnasmittable first layer 451, and a second layer 455 having a refraction index different from a refraction index of the first layer 451. The refraction index of the first layer 451 may be, for example, more than the refraction index of the second layer 455. For example, the refraction index of the first and second layers 451 and 455 may be from about 1.3 to about 2.4, and a difference between the refraction index of the first and second layers 451 and 455 may be, for example, greater than equal to 0.1.

The first layer 451 and the second layer 455 may include, for example, one of $SiO_2$ and $TiO_2$. For example, the first layer 451 may include $TiO_2$, and the second layer 455 may include $SiO_2$. A refraction index of the $TiO_2$ may be, for example, more than a refraction index of the $SiO_2$. The deposition layer 450 may reflect light having predetermined wavelength between the first layer 451 and the second layer 455. The deposition layer 450 may determine the color of the window member 400 in the non-transmitting region NAR.

As an example, the deposition layer 450 having the first layer 451 and the second layer 455 is described. However, the deposition layer 450 may include a plurality of units having the first layer 451 and the second layer 455. The light blocking layer 460 may be disposed on the other surface of the deposition layer 450. The light blocking layer 460 may include materials for blocking light, and preventing that light from being transmitted. For example, the light blocking layer 460 may include metal having low reflectance such as Cr and/or Mo. The light blocking layer 460 may include an opaque inorganic materials such as $CrO_x$ and/or $MoO_x$. The light blocking layer 460 may include an opaque organic materials having such as white resin and/or black resin.

Figure 7:
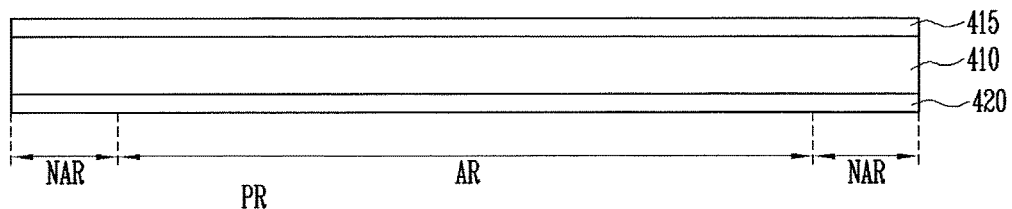
FIGS. 7 to 10, FIG. 12 and FIG. 13 illustrate cross-sectional views of a method for fabricating the window member in FIG. 3.
Figure 8:
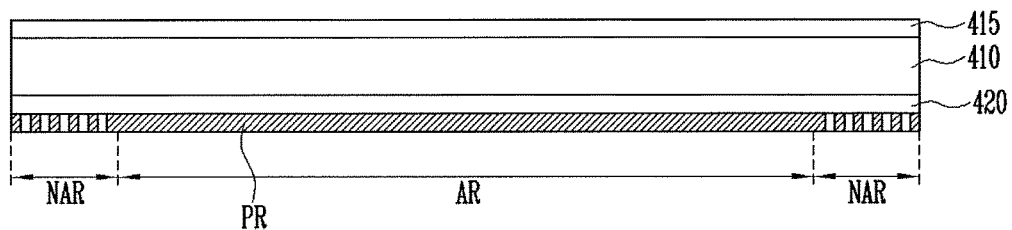
Figure 9:
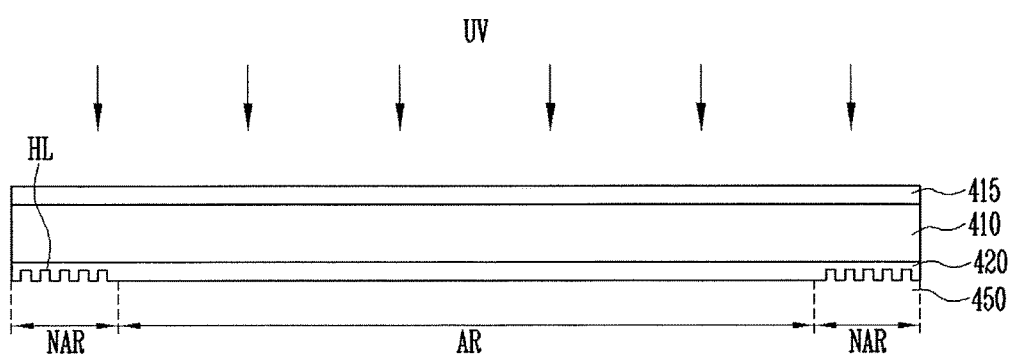
Figure 10:
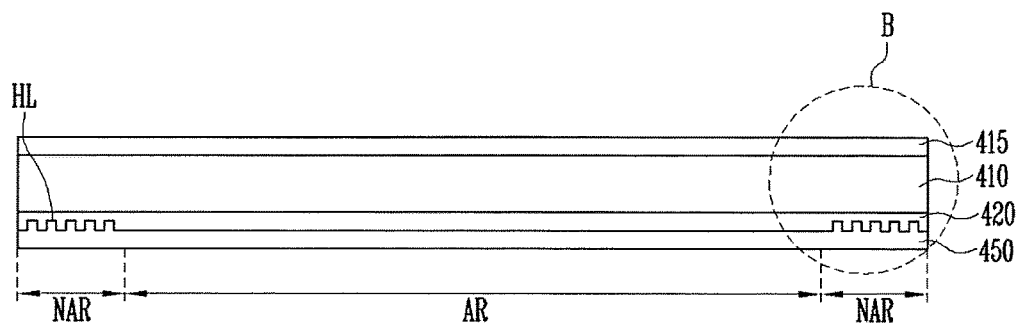
Figure 11:
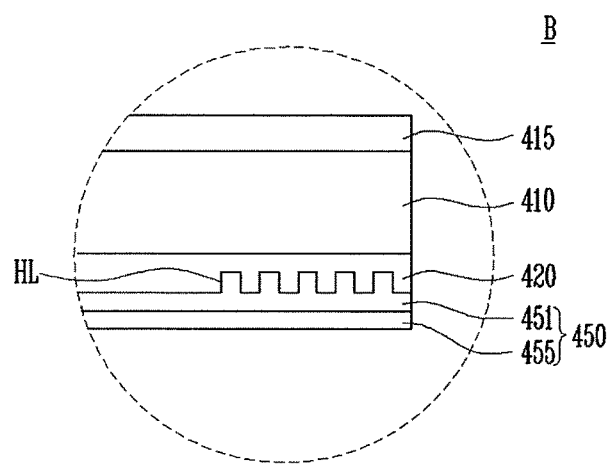
FIG. 11 illustrates an enlarged view of a region "B" in FIG. 10.

FIGS. 7 to 10, FIG. 12 and FIG. 13 illustrate cross-sectional views of a method for fabricating the window member in FIG. 3, and FIG. 11 illustrates an enlarged view of a region "B" in FIG. 10. Referring to FIG. 7, a transparent substrate 410 may be prepared. The transparent substrate 410 may be light-transmittable. The transparent substrate 410 may have, for example, a square shape having rounded corners. The transparent substrate 410 may be a reinforced plastic substrate or reinforced glass substrate. The transparent substrate 410 may have a transmission region AR light-transmittable and a non-transmission region NAR adjacent to at least a part of the transmission region AR. The non-transmission region NAR may surround the transmission region AR.

After preparing the transparent substrate 410, a protection layer 415 may be disposed on a surface of the transparent substrate 410. The protection layer 415 may be an anti-fouling (AF) coating layer. The protection layer 415 may prevent a fingerprinting on the transparent substrate 410 and improve scratch resistance. After disposing the protection layer 415, a light curable adhesive layer 420 may be disposed on the other surface of the transparent substrate 410. A surface of the light curable adhesive layer 420 may make contact the other surface of the transparent substrate 410. The light curable adhesive layer 420 may include a transparent adhesive. A storage modulus of the transparent adhesive in semi-solid state may be, for example, greater than or equal to about $10^3$ Pa to less than about $10^6$ Pa at room temperature before curing.

Referring to FIGS. 8 and 9, after disposing the light curable adhesive layer 420, a plurality of micro patterns HL may be disposed on an exposed surface of the light curable adhesive layer 420 in the non-transmitting region NAR. The micro patterns HL may be disposed by photo-lithography. A photo-resist pattern PR may be disposed on the exposed surface of the light curable adhesive layer 420. The photo-resist pattern PR may expose a portion of the light curable adhesive layer 420 in the non-transmitting region NAR. After disposing the photo-resist pattern PR, an etching process using the photoresist pattern PR may proceed. The light curable adhesive layer 420 may be etched until a predetermined depth of the light curable adhesive layer 420 in the etching process. The micro patterns HL may be disposed on the exposed surface of the light curable adhesive layer 420 in the non-transmitting region NAR.

After the etching process, the photo-resist pattern PR may be removed. After removing the photo-resist pattern PR, the light curable adhesive layer 420 may be cured by irradiating a light such as UV. A storage modulus of the light curable adhesive in solid state may be, for example, greater than or equal to about $10^6$ Pa at room temperature after curing.

Referring to FIGS. 10 to 11, after curing the light curable adhesive layer 420, a deposition layer 450 may be disposed on an exposed surface of the light curable adhesive layer 420. The deposition layer 450 may have a plurality of layers having different refraction index. For example, the deposition layer 450 may have a light-transmittable first layer 451, and a second layer 455 having a refraction index different from a refraction index of the first layer 451.

The deposition layer 450 may be disposed as follows. The first layer 451 may be disposed on the exposed surface of the light curable adhesive layer 420. Then, the second layer 455 may disposed on the first layer 451. The refraction index of the first layer 451 may be, for example, more than the refraction index of the second layer 455. For example, the refraction index of the first and second layers 451 and 455 may be from about 1.3 to about 2.4, and a difference between the refraction index of the first and second layers 451 and 455 may be greater than or equal to about 0.1. The deposition layer 450 may reflect light having predetermined wavelength between the first layer 451 and the second layer 455 due to the difference between the refraction indices of the first and second layers 451.

Figure 12:
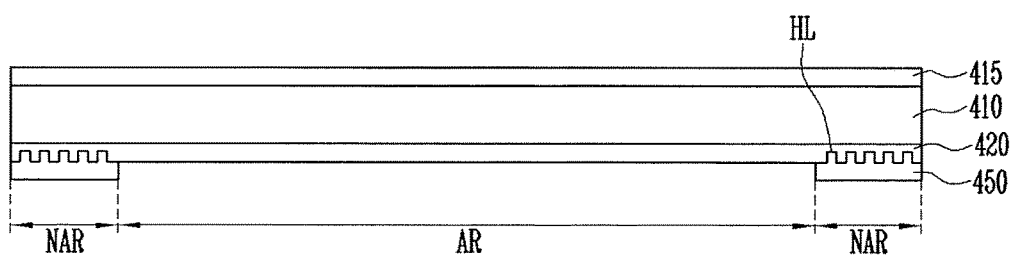
Figure 13:
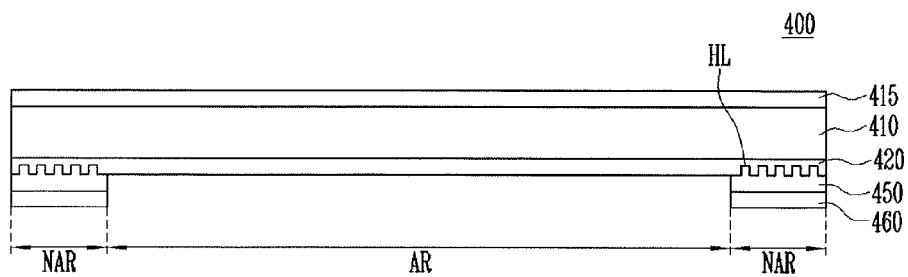

Referring to FIG. 12. after disposing the deposition layer 450, the deposition layer 450 may be etched in the transmitting region AR. The deposition layer 450 may determine a color of the window member 400 in the non-transmitting region NAR. Referring to FIG. 13, after etching the deposition layer 450, a light blocking layer 460 may be disposed on the deposition layer 450. The light blocking layer 460 may include materials for blocking light, and for preventing that light from being transmitted. For example, the light blocking layer 460 may include metal having low reflectance such as Cr and/or Mo. The light blocking layer 460 may include an opaque inorganic materials such as $CrO_x$ and/or $MoO_x$. The light blocking layer 460 may include an opaque organic material having such as white resin and/or black resin. As an example, disposing the light blocking layer 460 after etching the deposition layer 450 is described. However, the deposition layer 450 and the light blocking layer 460 may be etched in the transmitting region AR after the deposition layer 450 and the light blocking layer 460 are disposed on the exposed surface of the light curable adhesive layer 420.

Figure 14:
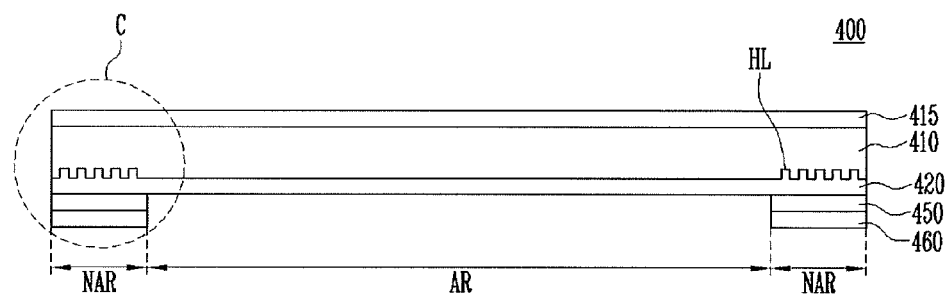
FIG. 14 illustrates a cross-sectional view of a window member.
Figure 15:
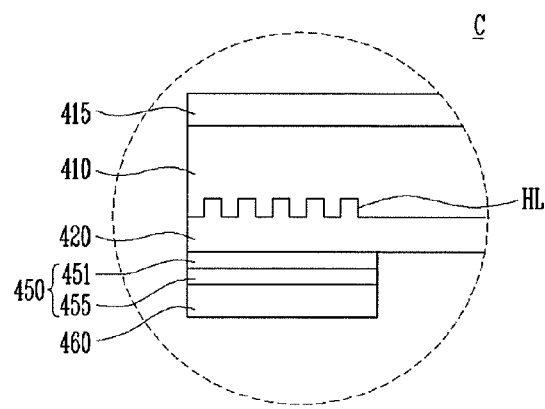
FIG. 15 illustrates an enlarged view of a region "C" in FIG. 14.

In FIGS. 14 and 15, the same reference numerals denote the same elements in FIGS. 1 to 13. FIG. 14 illustrates a cross-sectional view of a window member, and FIG. 15 illustrates an enlarged view of a region "C" in FIG. 14. Referring to FIGS. 14 and 15, a window member 400 may include a transmission region AR light-transmittable and a non-transmission region NAR adjacent to at least a part of the transmission region AR. The non-transmission region NAR may surround the transmission region AR. In addition, at least a part of the non-transmission region NAR may be defined as an input icon region NAR-I.

The window member 400 may include a transparent substrate 410, a protective layer 415 on a surface of the transparent substrate 410, a light curable adhesive layer 420 on anther surface of the transparent substrate 410, a deposition layer 450 on the light curable adhesive layer 420 in the non-transmission region NAR, and a light blocking layer 460 on the deposition layer 450. The transparent substrate 410 may be a reinforced plastic substrate or reinforced glass substrate. In the non-transmission region NAR, a plurality of micro patterns HL, such as a hairline or a hologram, may be on the other surface of the transparent substrate 410.

The light curable adhesive layer 420 may be on the other surface of the transparent substrate 410. The light curable adhesive layer 420 may include a transparent adhesive. The transparent adhesive may be semi-solid state at room temperature before curing. A storage modulus of the transparent adhesive in semi-solid state may be, for example, greater than equal to about $10^3$ Pa to less than about $10^6$ Pa at room temperature before curing. The transparent adhesive may be cured to solid state by irradiating UV. The storage modulus of the transparent adhesive in solid state may be greater than or equal to about $10^6$ Pa at room temperature after curing. The storage modulus of the transparent adhesive in solid state may be greater than or equal to about $10^7$ Pa at room temperature after curing.

The window member 400 may be produced as follows. A transparent substrate 410 may be prepared. The transparent substrate 410 may be light-transmittable. The transparent substrate 410 may have a transmission region AR light-transmittable and a non-transmission region NAR adjacent to at least a part of the transmission region AR. After preparing the transparent substrate 410, a protection layer 415 may be disposed on a surface of the transparent substrate 410. The protection layer 415 may be an anti-fouling (AF) coating layer. Then, micro patterns HL may be disposed on the other surface of the transparent substrate 410 in the non-transmitting region NAR. Herein, the micro patterns HL may be disposed by photo-lithography.

A photo-resist pattern PR may be disposed on the other surface of the transparent substrate 410. The photo-resist pattern PR may expose a portion of the transparent substrate 410 in the non-transmitting region NAR. After disposing the photo-resist pattern PR, an etching process using the photoresist pattern PR may proceed. The transparent substrate 410 may be etched until a predetermined depth of the transparent substrate 410 in the etching process. The micro patterns HL may be disposed on the other surface of the transparent substrate 410 in the non-transmitting region NAR.

After the etching process, the photo-resist pattern PR may be removed. After removing the photo-resist pattern PR, a light curable adhesive layer 420 may be disposed on the other surface of the transparent substrate 410. Then, the light curable adhesive layer 420 may be cured by irradiating a light such as UV. A storage modulus of the transparent adhesive in semi-solid state may be, for example, greater than or equal to about $10^3$ Pa to less than about $10^6$ Pa at room temperature before curing. A storage modulus of the light curable adhesive in solid state may be, for example, greater than or equal to about $10^6$ Pa at room temperature after curing. After curing the light curable adhesive layer 420, a deposition layer 450 and a light blocking layer 460 may be disposed on the light curable adhesive layer 420. Disposing the deposition layer 450 and the light blocking layer 460 may be the same as shown in FIGS. 1 to 13.

By way of summation and review, a window may have a window glass and a polymer film. The window glass and a polymer film may be coupled by a transparent adhesive. The window may have a plurality of layers or films such as the window glass, the transparent adhesive, and the polymer film, which may increase a thickness of the window.

In contrast, a method for fabricating a window member is disclosed herein that is capable of lightening weight and slimming thickness.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for fabricating a window member, the method comprising:

preparing a transparent substrate including a transmitting region and a non-transmitting region;
disposing a light curable adhesive layer on the transparent substrate, the light curable adhesive layer including a transparent adhesive in a semi-solid state;
forming a plurality of micro patterns in the light curable adhesive layer in the non-transmitting region; and
curing the light curable adhesive layer having the micro patterns formed therein by light irradiation,
wherein a storage modulus of the transparent adhesive is greater than or equal to about $10^3$ Pa and less than about $10^6$ Pa at room temperature before curing, and greater than or equal to $10^6$ Pa at room temperature after curing.

2. The method as claimed in claim 1, wherein forming the micro patterns includes:
disposing a photoresist pattern on the light curable adhesive layer, the photoresist pattern having holes exposing the light curable adhesive layer in non-transmitting region;
etching the light curable adhesive layer using the photoresist pattern; and
removing the photoresist pattern.

3. The method as claimed in claim 2, further comprising:
disposing a deposition layer having a plurality of layers having different refraction index on the light curable adhesive layer;
removing the light curable adhesive layer and the deposition layer in the transmitting region; and
disposing a light blocking layer on the deposition layer in the non-transmitting region.

4. The method as claimed in claim 3, wherein disposing the deposition layer includes:
disposing a first layer transmitting light on the light curable adhesive layer; and
disposing a second layer having a refraction index less than a refraction index of the first layer on the first layer.

5. The method as claimed in claim 1, wherein the transparent adhesive includes an acrylic copolymer composed of solution polymerizable acrylic compounds and reactive initiators, and UV curable compounds.

6. The method as claimed in claim 5, wherein the solution polymerizable acrylic compounds include at least one of acrylic acid, 2-ethylhexyl acrylate, 2-methylbutyl acrylate, isooctyl acrylate, lauryl acrylate, ethyl acrylate, butyl acrylate, hexyl acrylate, octyl acrylate, decyl acrylate, isodecyl acrylate and a combination thereof.

7. The method as claimed in claim 6, wherein the solution polymerizable acrylic compounds include from about 30 percent by weight to about 60 percent by weight of butyl acrylate, from about 30 percent by weight to about 60 percent by weight of 2-ethylhexyl acrylate, and from about 0.1 percent by weight to about 40 percent by weight of acrylic acid based on a total weight of the solution polymerizable acrylic compounds.

8. The method as claimed in claim 5, wherein the reactive initiators include at least one of benzoyl peroxide, acetyl peroxide, dilauryl peroxide, hydrogen peroxide, potassium persulfonate, 2,2'-azobis(isobutyronitrile), and a combination thereof.

9. The method as claimed in claim 5, wherein the UV curable compounds include at least one of caprolactone acrylate, 1,6-hexanediol diacrylate, trimethylolpropane triacrylate, pentaerythritol triacrylate, lauryl acrylate, urethane acrylate, epoxy acrylate, polyester acrylate, silicon acrylate, and a combination thereof.

10. The method as claimed in claim 9, wherein the UV curable compounds include from about 5 percent by weight to about 50 percent by weight of trimethylolpropane triacrylate, from about 5 percent by weight to about 50 percent by weight of multi-functional urethane acrylate, and from about 5 percent by weight to about 50 percent by weight of 1,6-hexanediol diacrylate based on a total weight of the UV curable compounds.

11. The method as claimed in claim 5, wherein the transparent adhesive further includes one or more photoinitiators.

12. The method as claimed in claim 5, wherein the acrylic copolymer and the UV curable compounds are in a weight ratio of from about 70:30 to about 95.5:0.5 in the transparent adhesive.

13. The method as claimed in claim 1, wherein the storage modulus of the transparent adhesive is greater than or equal to about $10^7$ Pa at room temperature after curing.

14. A method for fabricating a window member, the method comprising:
preparing a transparent substrate including a transmitting region and a non-transmitting region;
forming a plurality of micro patterns in a surface of the transparent substrate in the non-transmitting region;
disposing a light curable adhesive layer on the surface of the transparent substrate on which the plurality of micro patterns are formed, the light curable adhesive filling spaces in the micro patterns; and
curing the light curable adhesive layer by light irradiation,
wherein the light curable adhesive layer includes a transparent adhesive, a storage modulus of the transparent adhesive is greater than or equal to about $10^3$ Pa and less than about $10^6$ Pa at room temperature before curing, and greater than or equal to $10^6$ Pa at room temperature after curing.

15. The method as claimed in claim 14, wherein disposing the micro patterns includes:
disposing a photoresist pattern on the transparent substrate, the photoresist pattern having holes exposing the transparent substrate in non-transmitting region;
etching the light curable adhesive layer using the photoresist pattern; and
removing the photoresist pattern.

* * * * *